(12) United States Patent
Kulp

(10) Patent No.: US 7,498,124 B2
(45) Date of Patent: Mar. 3, 2009

(54) SACRIFICIAL SURFACTANATED PRE-WET FOR DEFECT REDUCTION IN A SEMICONDUCTOR PHOTOLITHOGRAPHY DEVELOPING PROCESS

(75) Inventor: John M. Kulp, Salado, TX (US)

(73) Assignee: Tokyo Electron Limited, Tokyo (JP)

( * ) Notice: Subject to any disclaimer, the term of this patent is extended or adjusted under 35 U.S.C. 154(b) by 897 days.

(21) Appl. No.: 10/675,419

(22) Filed: Sep. 30, 2003

(65) Prior Publication Data

US 2005/0069821 A1    Mar. 31, 2005

(51) Int. Cl.
G03C 5/00 (2006.01)
G03D 3/00 (2006.01)
B08B 9/04 (2006.01)

(52) U.S. Cl. .................. 430/434; 430/311; 134/24; 396/627

(58) Field of Classification Search ............. None
See application file for complete search history.

(56) References Cited

U.S. PATENT DOCUMENTS

| 5,845,170 A | 12/1998 | Ogata ............... 396/604 |
| 6,117,486 A | 9/2000 | Yoshihara ............ 427/240 |
| 6,132,940 A | 10/2000 | Mih et al. ............ 430/394 |
| 6,136,514 A | 10/2000 | Phan et al. ........... 430/327 |
| 6,147,010 A | 11/2000 | Whitman ............. 438/782 |
| 6,159,662 A | 12/2000 | Chen et al. ........... 430/313 |
| 6,402,398 B1 | 6/2002 | Szajewski et al. ...... 396/604 |
| 6,420,101 B1 | 7/2002 | Lu et al. ............. 430/326 |
| 6,472,127 B1 | 10/2002 | Takizawa ............. 430/322 |
| 2002/0058202 A1* | 5/2002 | Maemori et al. ....... 430/270.1 |
| 2004/0029026 A1* | 2/2004 | Hayasaki et al. ......... 430/30 |

FOREIGN PATENT DOCUMENTS

WO    WO 01/63365    8/2001

\* cited by examiner

*Primary Examiner*—Daborah Chacko Davis
(74) *Attorney, Agent, or Firm*—Wood, Herron & Evans, LLP

(57) ABSTRACT

A method and apparatus for developing a resist on a substrate in which a sacrificial surfactant-containing liquid is first applied to a resist as a pretreatment to reduce developing process defects and to improve the development process time and the uniformity of the resist. The pretreatment is followed by supplying a developing solution to the resist and thereafter developing the resist.

15 Claims, 4 Drawing Sheets

SACRIFICIAL SURFACTANATED PRE-WET FOR DEFECT REDUCTION IN A SEMICONDUCTOR PHOTOLITHOGRAPHY DEVELOPING PROCESS

FIELD OF THE INVENTION

The present invention relates to a method for a developing process of a substrate such as a semiconductor wafer subjected to an exposure treatment, and an apparatus for supplying a surfactant-containing liquid and a developing solution.

BACKGROUND OF THE INVENTION

In a manufacturing process of a semiconductor device, a prescribed circuit pattern is formed on the surface of a semiconductor wafer by using a so-called "photolithography technology". In the photolithography step, a series of treatments are carried out such that a resist film is formed on a cleaned semiconductor wafer by supplying a photoresist solution onto the semiconductor wafer, followed by exposing the resist film to light in a prescribed pattern and subsequently developing the pattern.

In the developing step, an exposed semiconductor wafer is held first by a rotatable spin chuck. Then, a puddle of a developing solution is formed by supplying a developing solution onto the surface of a semiconductor wafer held by the spin chuck, and the developing solution supplied onto the surface of the semiconductor wafer is left to stand for a prescribed time so as to permit the developing reaction to proceed. In the next step, a rinsing liquid such as pure water is supplied onto the semiconductor wafer while rotating the semiconductor wafer so as to rinse the semiconductor wafer. Finally, the supply of the rinsing liquid onto the semiconductor wafer is stopped, and the semiconductor wafer is rotated at a high speed so as to dry the semiconductor wafer by spin-drying in this case, a tetramethylammonium hydroxide (TMAH) solution having a fixed concentration of, for example, 2.38% by weight is used as the developing solution for the various resist materials.

It was possible in the past to obtain the required defect control with the standard process. In recent years, however, light having a shorter wavelength has come to be used for the exposure, and the pattern exposed and constructed by the light has been made finer and finer. Under these circumstances, it is difficult to form a defect-free circuit pattern by the conventional method for the developing process.

A significant mechanism for defect formation is the relation between the physical properties of the current photoresist materials and the current developing materials. The photoresist materials exhibit low surface energy, and the liquid developing materials exhibit high surface tension. This combination results in a high contact angle between the photoresist surface and the spreading developing liquid. This high contact angle opposes uniform spreading of the developing liquid and can cause the liquid to capture small air bubbles (microbubbles). It can also increase capture of defect-causing particulates that may be on the surface.

Several approaches have been tried to reduce this defect-causing event. For example, surfactants have been added to the developing materials to reduce the contact angle of the spreading developing liquid. In other examples, complex mechanisms have been invented to apply the developing liquid with unique nozzle configurations and spinning wafer application. These approaches have had limited success. Adding surfactant to the developing liquid itself affects the developing characteristics. The complex mechanisms and spin/dispense recipes are difficult to program and control repeatably, and they do not resolve the fundamental problem of high contact angle.

SUMMARY OF THE INVENTION

According to one embodiment of the present invention, there is provided a method for developing a resist film formed on a substrate, the method comprising the steps of: applying a surfactant-containing layer to form a defect-free liquid layer on the wafer surface; then, displacing the surfactant containing layer with a developing solution of appropriate concentration; and performing a developing process on the exposed resist film using the appropriate developing solution.

In the method for the developing process according to the present invention, it is possible to carry out the developing process by using a developing solution having an appropriate concentration conforming to the characteristics of the resist film and the surfactant-containing layer relative to the developing solution. Further, since the displacement of the surfactant-containing layer with developing liquid precludes the defect causing mechanism of high contact angle, it is possible to obtain a circuit pattern with fewer defects related to that mechanism.

According to the present invention, provided is an apparatus for supplying a surfactant-containing liquid and a developing solution, which can be suitably employed in the method of the present invention for the developing process described above. Additionally, the present invention addresses the fundamental problem of high developing liquid contact angle directly by using a sacrificial surfactanated pre-wet step prior to supplying developing solution to the wafer surface. The pre-wet can be a material that is compatible with the developing chemical; however, it will have surfactant added to provide a uniform defect-free liquid film on the surface. Because the sacrificial pre-wet is not a process active chemical, other concerns are minimized, such as undesired chemical reactions. This non-active, defect-free film is displaced by the dispensing of the actual developing process chemical. The balance of the developing process is carried out as described in the Background of the Invention. By this approach, the defect mechanism of the high developing liquid contact angle on the resist surface is substantially, if not completely, avoided.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DETAILED DESCRIPTION

Figure 1:
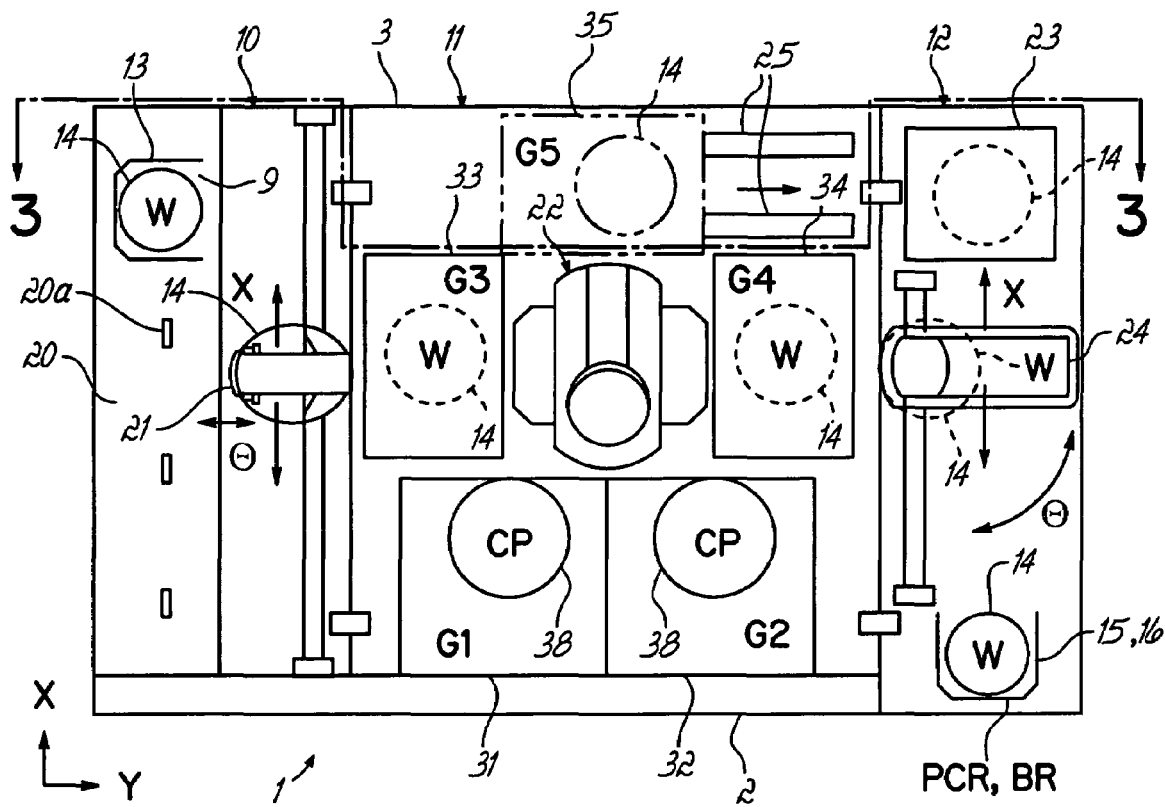
FIG. 1 is a top view of a schematic diagram of the coating/developing process system according to an embodiment of the present invention.

The method of the present invention includes the addition of a process step prior to the developing solution dispensing step in the developing process of a semiconductor photolithography process, followed by a modified developing dispensing step. The added process step is the dispensing of a sacrificial surfactant-containing liquid onto the surface of a photoresist coated semiconductor wafer, such as a silicon wafer, to form a defect-free liquid film on that surface. This film is subsequently displaced by a slightly modified developing solution dispensing step to achieve a uniform defect-free layer of developing solution on the surface of the wafer.

For example, the added process step may comprise dispensing a sacrificial layer of deionized water to which a non-contaminating surfactant has been added, to thereby form a defect-free liquid film on the wafer surface. This film is subsequently displaced by dispensing a tetramethylammonium hydroxide (TMAH)-based developing solution onto the surface to achieve a uniform defect-free layer of TMAH-based developing chemical on the surface of the wafer. This step is modified by adjusting the concentration of the developing solution in accordance with one or more characteristics of the surfactant-containing liquid and/or resist film. The balance of the process remains the same as current developing technology, namely, the developing solution is left on the surface for a prescribed time to permit the developing reaction to proceed, followed by rinsing and drying the developed wafer surface.

By way of example, the present invention can comprise dispensing hardware mounted in the developer module of a coater/developer process tool, such as the TEL ACT 12, available from Tokyo Electron Limited, Tokyo, Japan, for the purpose of dispensing a surfactant-containing pre-wet liquid prior to the developing solution dispensing step of the semiconductor photolithography process. In addition, the present invention can comprise advanced dispensing hardware that allows the developing solution dispensing step to very quickly follow the completion of the pre-wet liquid dispensing step.

Various embodiments of the present invention will now be described in detail with reference to the accompanying drawings. A method is described for a developing process using a resist coating and development system, which permits continuously carrying out the process steps ranging between formation of the resist coating on a semiconductor wafer and the developing process.

The coating/developing process system for a semiconductor wafer to which the present invention is applied, will now be explained with reference to FIGS. 1 to 3.

The coating/developing process system 1 comprises a cassette station 10, a process station 11, and an interface section 12, which are contiguously formed as one unit.

In the cassette station 10, a cassette (CR) 13 for storing a plurality of wafers (W) 14 (e.g. 25 wafers) serving as a substrate is loaded into and unloaded from the system 1. The process station 11 includes various single-wafer processing units for applying a predetermined treatment required for a coating/developing step to wafers (W) 14 one by one. These process units are arranged in predetermined positions of multiple stages, for example, within first (G1), second (G2), third (G3), fourth (G4) and fifth (G5) multiple-stage process unit groups 31, 32, 33, 34, 35. The interface section 12 delivers the wafers (W) 14 between the process station 11 and an exposure unit (not shown) that can be abutted against the process station 11.

The cassette station 10 has a cassette table 20 having positioning-projections 20a thereon, as shown in FIG. 1. A plurality of wafer cassettes (CR) 13 (for example, at most 4) are mounted on the positioning-projections 20a. The wafer cassettes (CR) 13 are thereby aligned in line in the direction of an X-axis (the up-and-down direction of FIG. 1) with a wafer inlet/outlet 9 facing the process station 11. The cassette station 10 includes a wafer transfer carrier 21 movable in the aligning direction (X-axis) of cassettes 13 and in the aligning direction (Z-axis, vertical direction) of wafers 14 stored in the wafer cassette (CR) 13. The wafer transfer carrier 21 gains access selectively to each of the wafer cassettes (CR) 13.

The wafer transfer carrier 21 is further designed rotatable in a Θ (theta) direction, so that it can gain access to an alignment unit (ALIM) 41 and an extension unit (EXT) 42 belonging to a third multiple-stage process unit group (G3) 33 in the process station 11, as described later.

The process station 11 includes a main wafer transfer mechanism 22 (movable up-and-down in the vertical direction) having a wafer transfer machine 46. All process units are arranged around the main transfer mechanism 22, as shown in FIG. 1. The process units may be arranged in the form of multiple stages G1, G2, G3, G4 and G5.

Figure 3:
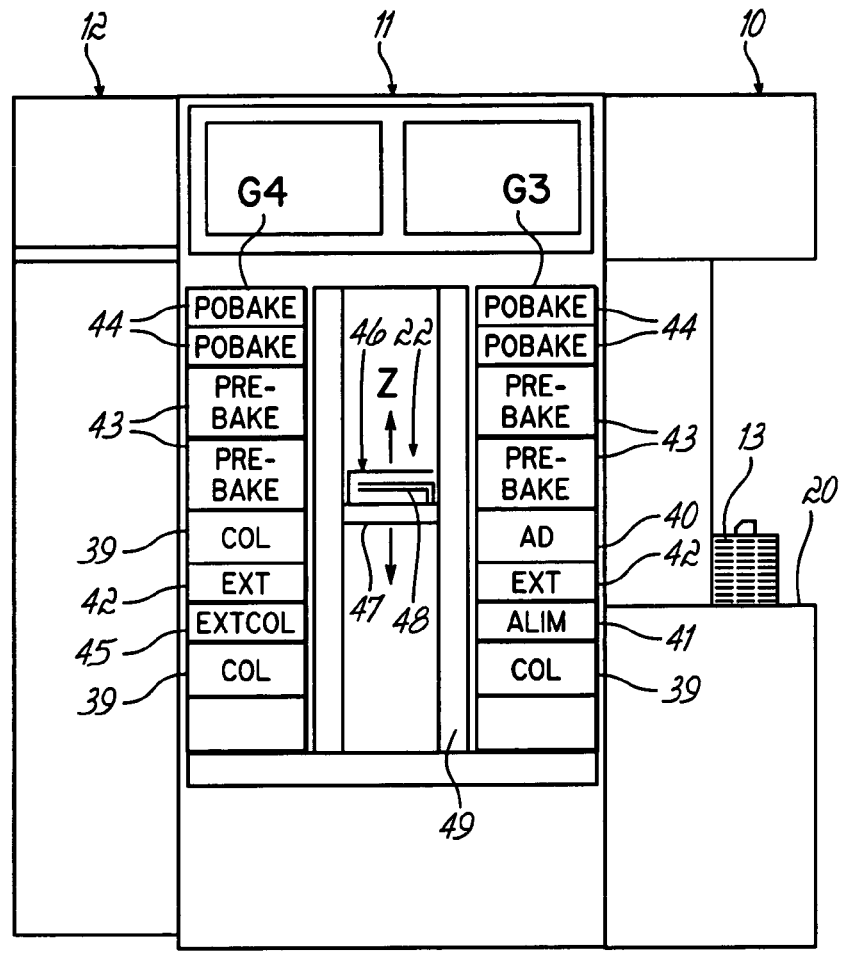
FIG. 3 is a partially cut-away back view showing schematically the details of the process unit groups in the center of the coating/developing process system of FIG. 1, as taken along line 3-3.

The main wafer transfer mechanism 22 has a wafer transfer machine 46 that is movable up and down in the vertical direction (Z-direction) within a hollow cylindrical supporter 49, as shown in FIG. 3. The hollow cylindrical supporter 49 is connected to a rotational shaft of a motor (not shown). The cylindrical supporter 49 can be rotated about the shaft synchronously with the wafer transfer machine 46 by the driving force of the motor rotation. Thus, the wafer transfer machine 46 is rotatable in the Θ direction. Note that the hollow cylindrical supporter 49 may be connected to another rotational axis (not shown), which is rotated by a motor.

The wafer transfer machine 46 has a plurality of holding members 48 which are movable back and forth on a table carrier 47. The wafer (W) 14 is delivered between the process units by the holding members 48.

In the process unit station 11 of this embodiment, five process unit groups G1, G2, G3, G4, and G5 can be sufficiently arranged. For example, first (G1) and second (G2) multiple-stage process unit groups 31, 32 are arranged in the front portion 2 (in the forehead in FIG. 1) of the system 1. A third multiple-stage process unit group (G3) 33 is abutted against the cassette station 10. A fourth multiple-stage process unit group (G4) is abutted against the interface section 12. A fifth multiple-stage process unit group (G5) can be optionally arranged in a back portion 3 of system 1.

Figure 2:
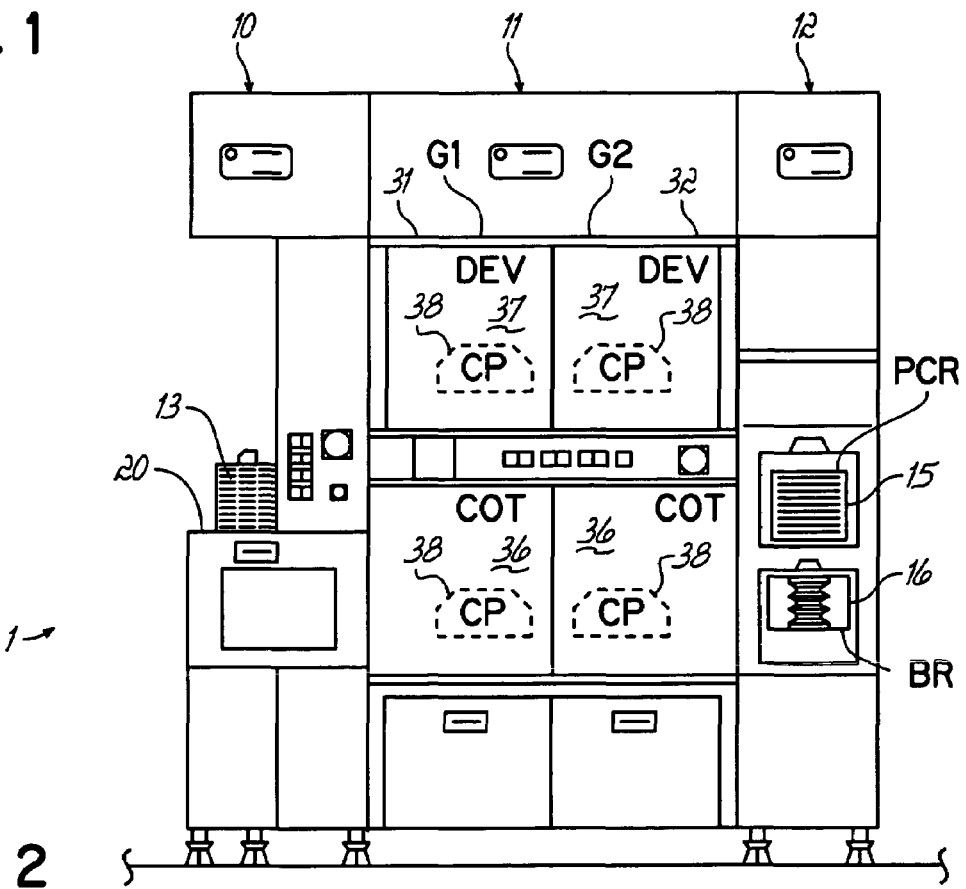
FIG. 2 is a front view of a schematic diagram showing the structure of the coating/developing process system of FIG. 1.

As shown in FIG. 2, in the first process unit group (G1) 31, two spinner-type process units, for example, a resist coating unit (COT) 36 and a developing unit (DEV) 37, are stacked in the order mentioned from the bottom. The spinner-type process unit used herein refers to a process unit in which a predetermined treatment is applied to the wafer (W) 14 mounted on a spin chuck 52 (see FIG. 4) placed in a cup (CP) 38. Also, in the second process unit group (G2) 32, two spinner process units such as a resist coating unit (COT) 36 and a developing unit (DEV) 37, are stacked in the order mentioned from the bottom. It is preferable that the resist coating unit (COT) 36 be positioned in a lower stage from a structural point of view and to reduce maintenance time associated with the resist-solution discharge. However, if necessary, the coating unit (COT) 36 may be positioned in the upper stage.

As shown in FIG. 3, in the third process unit group (G3) 33, open-type process units, for example, a cooling unit (COL) 39 for applying a cooling treatment, an alignment unit (ALIM) 41 for performing alignment, an extension unit (EXT) 42, an adhesion unit (AD) 40 for applying an adhesion treatment to increase the deposition properties of the resist, two pre-baking units (PREBAKE) 43 for heating a wafer 14 before light-exposure, and two post-baking units (POBAKE) 44 for heating a wafer 14 after light exposure, are stacked in eight stages in the order mentioned from the bottom. The open type process unit used herein refers to a process unit in which a predetermined treatment is applied to a wafer 14 mounted on a support platform within one of the processing units. Similarly, in the fourth process unit (G4) 34, open type process units, for example, a cooling unit (COL) 39, an extension/cooling unit (EXTCOL) 45, an extension unit (EXT) 42, another cooling unit (COL), two pre-baking units (PREBAKE) 43 and two post-baking units (POBAKE) 44 are stacked in eight stages in the order mentioned from the bottom.

Since the process units for low-temperature treatments, such as the cooling unit (COL) 39 and the extension/cooling unit (EXTCOL) 45, are arranged in the lower stages and the process units for higher-temperature treatments, such as the pre-baking units (PREBAKE) 43 and the post-baking units (POBAKE) 44 and the adhesion unit (AD) 40 are arranged in the upper stages in the aforementioned unit groups, thermal interference between units can be reduced. Alternatively, these process units may be arranged differently.

The interface section 12 has the same size as that of the process station 11 in the X direction but shorter in the width direction. A movable pickup cassette (PCR) 15 and an unmovable buffer cassette (BR) 16 are stacked in two stages in the front portion of the interface section 12, an optical edge bead remover 23 is arranged in the back portion, and a wafer carrier 24 is arranged in the center portion. The wafer transfer carrier 24 moves in the X-and Z-directions to gain access to both cassettes (PCR) 15 and (BR) 16 and the optical edge bead remover 23. The wafer carrier 24 is also designed rotatable in the Θ direction, so that it can gain access to the extension unit (EXT) 42 located in the fourth multiple-stage process unit group (G4) 34 in the process station 11 and to a wafer deliver stage (not shown) abutted against the exposure unit (not shown).

In the coating/developing process system 1, the fifth multiple-stage process unit group (G5, indicated by a broken line) 35 is designed to be optionally arranged in the back portion 3 at the backside of the main wafer mechanism 22, as described above. The fifth multiple-stage process unit group (G5) 35 is designed to be shifted sideward along a guide rail 25 as viewed from the main wafer transfer mechanism 22. Hence, when the fifth multiple-stage process unit group (G5) 35 is positioned as shown in FIG. 1, a sufficient space is obtained by sliding the fifth process unit group (G5) 35 along the guide rail 25. As a result, a maintenance operation to the main wafer transfer mechanism 22 can be easily carried out from the back side. To maintain the space for maintenance operation to the main wafer transfer mechanism 22, the fifth process unit group (G5) 35 may be not only slid linearly along the guide rail 25 but also shifted rotatably outward in the system.

Figure 4:
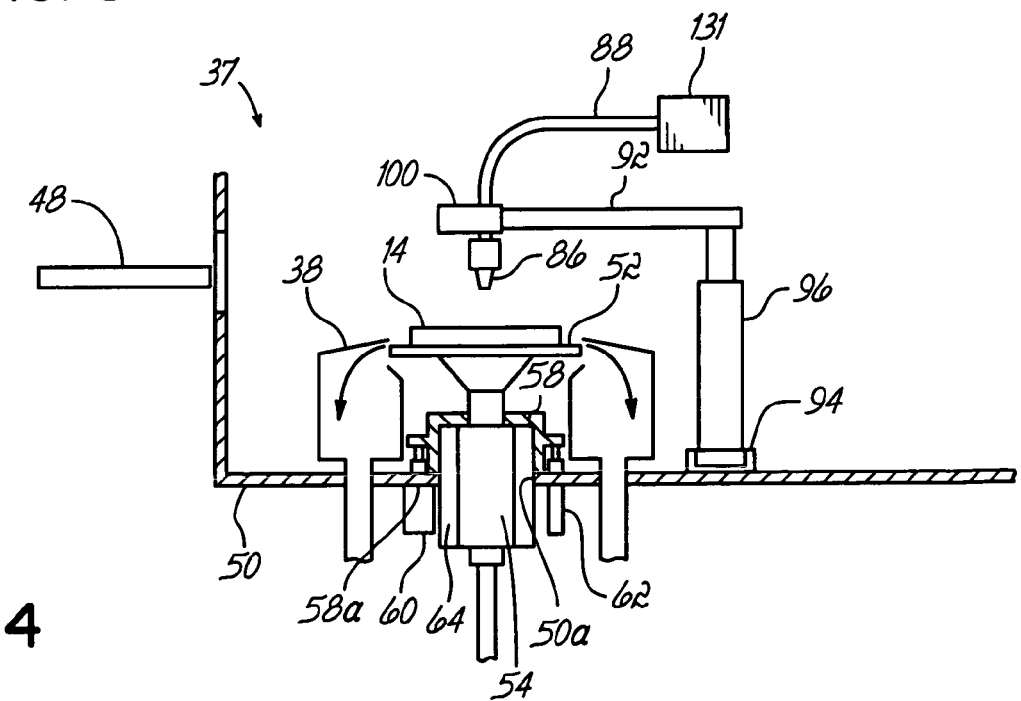
FIG. 4 is a cross-sectional view of a developing unit (DEV) in the coating/developing process system of FIG. 1.
Figure 5:
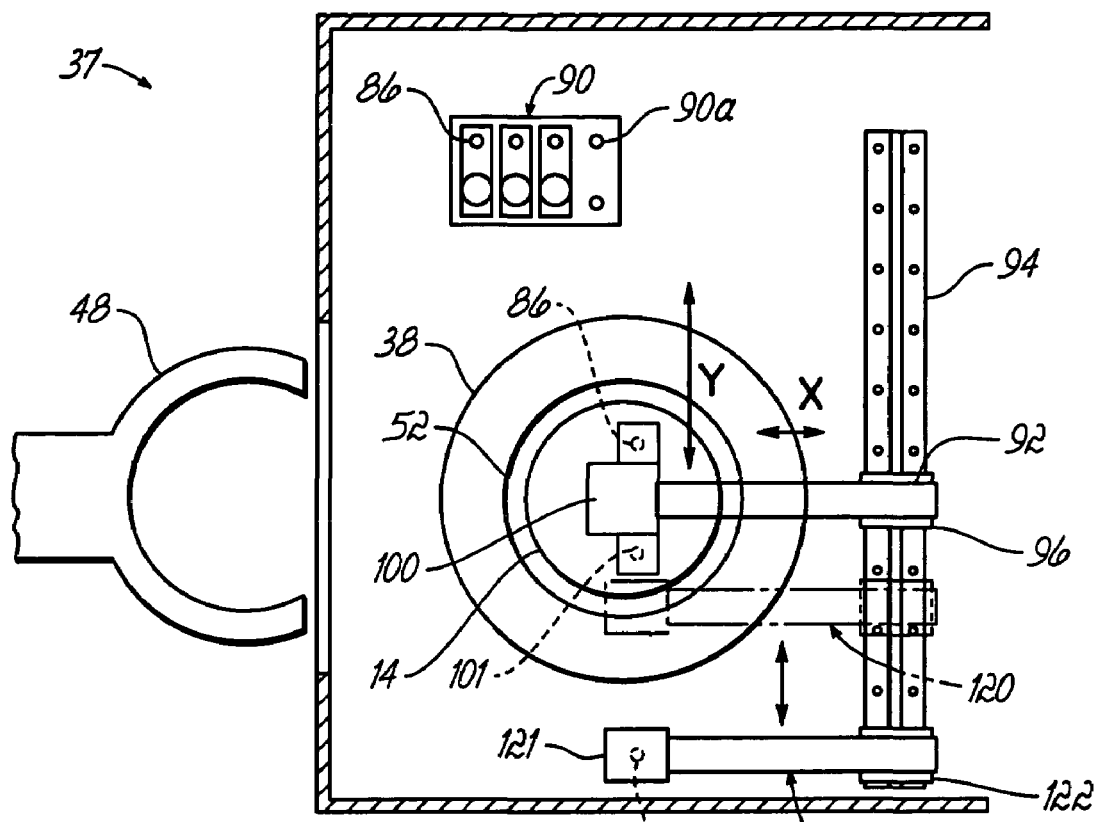
FIG. 5 illustrates a plan view schematically showing the construction of the developing unit (DEV)

Now, the developing unit (DEV) 37, according to this embodiment will be explained. FIGS. 4 and 5 are a schematic cross-sectional view and a schematic plan view, respectively, of a structure of the developing unit (DEV) 37.

A circular cup (CP) 38 is positioned at the center of the developing unit (DEV) 37. A spin chuck 52 is positioned within the circular cup (CP) 38. The spin chuck 52 with a semiconductor wafer (W) 14 fixed thereon by vacuum absorption is rotated by a driving motor 54. The driving motor 54 is liftably arranged at an opening 50a provided in a unit bottom plate 50. The driving motor 54 is further connected to an up-and-down drive machine 60 including an air cylinder and to an up-and-down guide unit 62 via a cap-form flange member 58 (e.g. made of aluminum). A cylindrical cooling jacket 64 made of, for example, stainless steel, is provided at the side surface of the driving motor 54. The flange member 58 is provided so as to cover the upper half portion of the cooling jacket 64.

When the resist is coated, a lower end 58a of the flange member 58 comes in tight contact with the unit bottom plate 50 at the outer circumference portion of the opening 50a. In this manner, the unit is sealed airtight. When the semiconductor wafer W is delivered between the spin chuck 52 and the holding member 48 of the main wafer transfer mechanism 22, the up-and-down drive machine 60 lifts the driving motor 54 together with the spin chuck 52 upwards, thereby separating the lower end of the flange member 58 upward from the unit bottom plate 50.

A developing solution nozzle 86 for supplying a developing solution to the surface of the semiconductor wafer W is connected to a developing solution supply 131 (described later) via a developing solution feed pipe 88. The developing solution nozzle 86 is detachably provided at a top end portion of a developing solution nozzle scan arm 92 via a nozzle supporter 100. The developing solution nozzle scan arm 92 is provided at the top of a vertical supporting member 96 which is horizontally movable along the guide rail 94 provided in one direction (the Y-axis) on the unit bottom 50. The developing solution scan nozzle arm 92 therefore moves in the Y-axis direction together with the vertical supporting member 96 by a Y-axis driving mechanism (not shown).

To mount the developing solution nozzle 86 selectively on the developing solution nozzle scan arm 92 in a developing solution nozzle standby unit 90, the developing solution nozzle scan arm 92 is movable in the X-direction (perpendicular to Y-direction) other than the Y-direction by an X-direction driving mechanism (not shown).

In one embodiment, the developing solution nozzle 86 can be configured to deposit the developing solution in a dropwise manner, and the nozzle can be positioned over the center of the substrate while depositing the developing solution in a dropwise manner onto a rotating substrate. For example, one or more drops can be deposited; the drops can be deposited at different rates; and the rotational speed of the wafer can be changed before, during, and after the developing solution is deposited.

In another embodiment, a developing solution nozzle can be configured to deposit the developing solution in a substantially circular shape, and the nozzle can be positioned over the center of the substrate while depositing the developing solution onto a rotating substrate. In an additional embodiment, a developing solution nozzle can be configured to deposit the developing solution in a band shape, and the nozzle can be moved over the substrate while depositing the developing solution onto a rotating substrate. In an alternate embodiment, the developing solution nozzle can be configured as a plurality of nozzles each capable of depositing the developing solution in a substantially circular or band shape, and the plurality of nozzles can be scanned over the substrate while depositing the developing solution.

Furthermore, the outlet of the developing solution nozzle 86 is inserted into a solvent atmosphere chamber (not shown) from a port 90a in the developing solution nozzle standby unit 90. However, even if the tip of the developing solution nozzle 86 is exposed to the solvent atmosphere it is designed such that the developing solution attached to a tip of the developing solution nozzle 86 is not solidified or degraded. Since a plurality of developing solution nozzles 86 are provided, a different nozzle is selected depending upon the type of developing solution provided.

The nozzle holder 100 of the developing solution nozzle scan arm 92 is equipped with a surfactant-containing liquid nozzle 101 for feeding a liquid agent such as surfactant-containing liquid to the wafer 14 surface in order to pre-wet the wafer surface before the developing solution is supplied. The surfactant-containing liquid nozzle 101 is connected to a surfactant-containing liquid supply (132, described later) by way of a surfactant-containing liquid feeding tube (not shown). The surfactant-containing liquid nozzle 101 and the developing solution nozzle 86 are fixed at the nozzle holder 100 in such a way that outlets thereof are placed in line along the Y-axis direction of the developing solution nozzle scan arm 92 moving directions.

In one embodiment, the surfactant-containing liquid nozzle 101 can be configured to deposit the surfactant-containing liquid in a dropwise manner, and the nozzle can be positioned over the center of the substrate while depositing the surfactant-containing liquid in a dropwise manner onto a rotating substrate. For example, one or more drops can be deposited; the drops can be deposited at different rates; and the rotational speed of the wafer can be changed before, during, and after the developing solution is deposited.

In another embodiment, a surfactant-containing liquid nozzle can be configured to deposit the surfactant-containing liquid in a substantially circular shape, and the nozzle can be positioned over the center of the substrate while depositing the surfactant-containing liquid onto a rotating substrate. In an additional embodiment, a surfactant-containing liquid nozzle can be configured to deposit the surfactant-containing liquid in a band shape, and the nozzle can be moved over the substrate while depositing the surfactant-containing liquid onto a rotating substrate. In an alternate embodiment, a surfactant-containing liquid nozzle can be configured as a plurality of nozzles each capable of depositing the surfactant-containing liquid in a substantially circular or band shape, and the plurality of nozzles can be scanned over the substrate while depositing the surfactant-containing liquid.

The vertical supporting member 96 for supporting the developing solution nozzle scan arm 92 and a vertical supporting member 122 (movable in the Y direction) for supporting a rinse nozzle scan arm 120 are provided on the guide rail 94. The tip portion 121 of the rinse nozzle scan arm 120 is equipped with a rinse nozzle 124 for rinsing the wafer 14. The rinse nozzle scan arm 120 and the rinse nozzle 124 are moved in parallel or in line between the rinse nozzle standby position (indicated by a solid line) set sideward of the cup (CP) 38 and a rinse solution spurting position (indicated by a dotted line) set right above the circumference of the semiconductor wafer (W) 14 mounted on the spin chuck 52, by a Y-axis driving mechanism (not shown).

Figure 6:
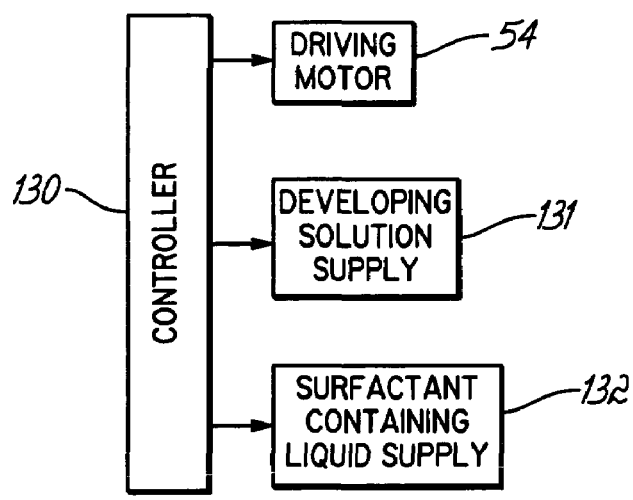
FIG. 6 is a block diagram of a control system of the developing unit (DEV) of FIG. 4.

FIG. 6 shows a simplified block diagram of a control system of the developing unit (DEV) 37. A controller 130 controls individual sections of the developing unit (DEV) 37, such as the driving motor 54, a developing solution supply 131, and a surfactant-containing liquid supply 132. For example, the controller 130 controls the rotational speed of the driving motor 54 during the application of the surfactant-containing liquid and application of the developing solution. In addition, the controller 130 controls developing solution feeding from the developing solution supply 131 to the developing solution nozzle 86 and surfactant-containing liquid feeding from the surfactant-containing liquid supply 132 to the surfactant-containing liquid nozzle 101.

Next, we will explain how to provide developing solution onto a resist layer on a substrate in the developing unit (DEV) 37 thus constructed.

When the semiconductor wafer (W) 14 is transferred into a position right above the cup (CP) 38 within the developing unit (DEV) 37 by the holding member 48 of the main wafer transfer mechanism 22, the semiconductor wafer is vacuum-absorbed on the spin chuck 52 which can ascend by the up-and-down drive machine 60 (an air cylinder) and the up-and-down guide unit 62. After the semiconductor wafer (W) 14 is vacuum-absorbed on the spin chuck 52, the holding member 48 of the main wafer transfer mechanism 22 is moved back from the developing unit (DEV) 37. In this manner, the semiconductor wafer (W) 14 is completely delivered to the developing unit (DEV) 37.

Subsequently, the spin chuck 52 is moved down so as to move the semiconductor wafer (W) 14 to a predetermined position in the cup (CP) 38 and then rotation of the spin chuck 52 is initiated by the driving motor 54. Thereafter, the nozzle holder 100 starts moving from the developing solution nozzle standby unit 90 along the Y-axis.

A supply to the surface of the rotating semiconductor wafer (W) 14 is initiated when the outlet of the surfactant-containing liquid nozzle 101 arrives at the center of the spin chuck 52 (the center of the semiconductor wafer 14). The supplied surfactant-containing liquid onto the wafer surface is uniformly spread by centrifugal force over the entire surface of the resist layer from the wafer center to the peripheral region thereof.

Following that, the nozzle holder 100 is moved in the Y direction until the outlet of the developing solution nozzle 86 arrives at the center of the spin chuck 52. Upon the arrival of the nozzle 86 at the center, the dropwise supply of the developing solution to the center of the semiconductor wafer surface from the outlet of the developing solution nozzle 86 is initiated, thereby coating the entire surface of the resist layer with the developing solution.

In this embodiment, the rotational speed of the driving motor 54, in other words, the rotational speed of the semiconductor wafer (W) 14 during the application of the surfactant-containing liquid and the developing solution may be controlled. For example, the semiconductor wafer (W) 14 can be rotated at a first speed during which a surfactant-containing liquid can be supplied from the surfactant-containing liquid nozzle 101 to the center of the semiconductor wafer 14. The wafer 14 continues to rotate at the first speed for a first period of time after the surfactant-containing liquid is supplied such that the surfactant-containing liquid is spread uniformly from the center of the semiconductor wafer (W) 14 to the peripheral region.

In addition, the semiconductor wafer (W) 14 can be rotated at a second speed during which a developing solution can be provided from the developing solution nozzle 86 to the center of the semiconductor wafer 14. The wafer 14 continues to rotate at the second speed for a second period of time after the developing solution is provided such that the developing solution is spread uniformly from the center of the semiconductor wafer (W) 14 to the peripheral region. In various embodiments, the first and second speeds can be the same or they can be different. After termination of the developing solution supply, the rotational speed of the semiconductor wafer (W) 14 can be changed, as desired.

The rotational control of the semiconductor wafer (W) 14 and the flow control of the surfactant-containing liquid during the surfactant-containing liquid application step and the rotational control of the semiconductor wafer (W) 14 and the flow control of the developing solution during the developing solution application step of this embodiment allows the developing solution to be supplied uniformly on the surface of a resist layer on the semiconductor wafer (W) 14.

Before the developing solution application step, if the entire surface of the resist layer on the semiconductor wafer (W) 14 is wetted with a surfactant-containing liquid as described above, i.e., subjected a surfactant-containing liquid pre-wetting treatment, the developing solution can be more easily spread. As a result, the uniform developing solution film can be formed with a smaller amount of the developing solution. In other words, developing solution consumption can be further reduced.

As described above, the surfactant-containing liquid nozzle 101 and the developing solution nozzle 86 may each be selected to have a configuration capable of depositing the liquid in a desired shape and fashion. For example, the liquids may be deposited in dropwise fashion or in a continuous stream. In addition, the liquids may be deposited in a circular shape or a band shape, for example.

The present invention is not limited to the aforementioned embodiments and can be modified in various ways.

Since the surfactant-containing liquid is supplied before the developing solution application step, a resist film can be uniformly covered by the developing solution even if the developing solution is supplied in a lower amount. It is therefore possible to reduce the consumption of the developing solution more effectively. In addition, the developing solution film can be formed so as to be thin and uniform.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The developing unit (DEV) 37 can include a rinse nozzle (124 FIG. 5) for providing a rinsing liquid to the wafer W. After the development process using a developing solution, the rinse nozzle 124 can be moved above the wafer W so as to provide a rinsing liquid onto the wafer W. For example, pure water, which can be a solvent of the developing solution, can be used as the rinsing liquid. The shape of the rinse nozzle 124 is not particularly limited. It is possible to use, for example, a pipe-like straight nozzle as the rinse nozzle 124.

In one embodiment, a TMAH developing solution having the concentration fixed to, for example, 2.38% can be used. However, since it is possible to provide a surfactant-containing liquid having a known concentration to the resist, and since it is possible to provide a developing solution having a suitable concentration in accordance with the characteristics of the surfactant-containing liquid and the resist film relative to the developing solution every time the developing processing is carried out, then it is possible to obtain a developed pattern (circuit pattern) excellent in, for example, the accuracy of the critical dimension (CD), and the uniformity of the CDs. In addition, a contact angle can be determined for the developing solution on the resist film, and a concentration for the surfactant-containing liquid can be determined in order to decrease the contact angle.

Figure 7:
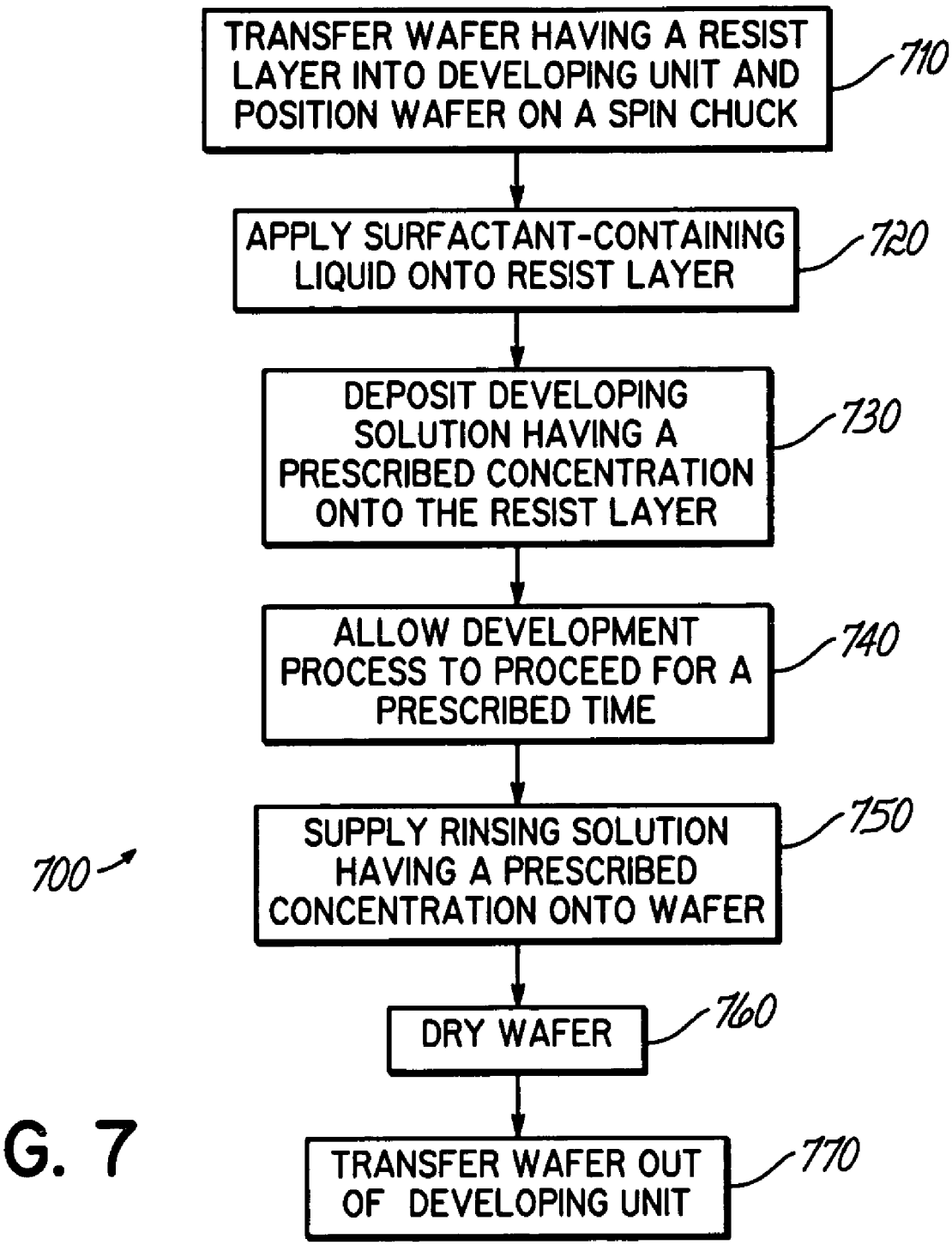
FIG. 7 is a flow chart showing a method for the developing process using a surfactant-containing liquid and a developing solution having the concentration adjusted in accordance with the characteristics of the surfactant-containing liquid and the resist film.

FIG. 7 is a flow chart showing a method for the developing processing using a surfactant-containing liquid and a developing solution having the concentration adjusted in accordance with the characteristics of the surfactant-containing liquid and the resist film. In 710, a wafer W having a prescribed circuit pattern subjected to an exposure treatment using, for example, a KrF ray, ArF ray or a $F_2$ ray, to a post-exposure baking treatment, and to a cooling process is transferred to developing unit (DEV) 37 by the holding member 48 of the main wafer transfer mechanism 22 onto a position right above the coater cup (CP) 38 and, then, held by vacuum suction on the spin chuck 52 moved upward by the vertical driving means 60.

In 720, a surfactant-containing liquid is applied onto the resist layer while rotating spin chuck 52 at a desired rotational speed. For example, the developing solution nozzle 86 can be positioned to face one end in the Y-direction of the wafer W. Under this condition, the developing solution nozzle 86 can be moved by the Y-axis driving mechanism 98 to the other end in the Y-direction of the wafer W while allowing the developing solution nozzle 86 to apply a surfactant-containing liquid having a prescribed concentration, e.g., approximately 2.0% or less, which is prepared by mixing at least two of pure water, a surfactant, and a solvent in the surfactant-containing liquid supply section 79b, so as to supply a surfactant-containing liquid of a prescribed concentration onto the wafer W. For example, during this time the developing solution supply nozzle 86 can be retreated into the nozzle standby unit 90 so as to be housed in the nozzle standby unit 90 and to be cleaned.

In 730, the developing solution is deposited on the wafer while rotating the spin chuck 52 at a desired rotational speed. For example, the developing solution nozzle 86 is again positioned to face one end in the Y-direction of the wafer W. Under this condition, the developing solution nozzle 86 is moved by the Y-axis driving mechanism 98 to the other end in the Y-direction of the wafer W while allowing the developing solution nozzle 86 to spurt in the form of a band a TMAH developing solution having a prescribed concentration, e.g., less than 2.0%, which is prepared by mixing a pure water with a TMAH developing solution having a concentration of 2.38% in the developing solution supply section 79a, so as to supply a developing solution of a prescribed concentration onto the wafer W.

Desirably, the developing solution is applied immediately after the surfactant-containing layer is applied. Alternately, a fixed amount of time is allowed to pass before the developing solution is applied.

In 740, after the wafer W is supplied with the developing solution of a prescribed concentration, the wafer W is left to stand for a prescribed time sufficient to permit a developing reaction to proceed. The spin chuck may be rotated at a desired speed during all or some of the prescribed time, or the wafer W may be held in a stationary position. For example, during this time the developing solution supply nozzle 86 can be retreated into the nozzle standby unit 90 so as to be housed in the nozzle standby unit 90 and to be cleaned.

In 750, a rinsing process is performed. For example, the rinse nozzle 124 can be moved to a region above the wafer W a prescribed time later, and the spin chuck 52 is rotated at a prescribed rotating speed while allowing the rinse nozzle 124 to spurt a pure water (rinsing liquid) so as to centrifugally remove the developing solution on the wafer W together with the rinsing liquid.

In 760, a drying process is performed. For example, the spin chuck 52 can be rotated at a higher rotating speed when the rinse nozzle 124 ceases to spurt the rinsing liquid, thereby drying the wafer W, i.e., spin drying.

In 770, the dried wafer W is transferred out of the developing unit (DEV) 37 by the procedure opposite to that in the case of transferring the wafer W into the developing unit (DEV) 37. Then, the wafer W can be transferred into a prescribed hot plate unit (HP) (not shown) so as to be subjected to a thermal drying treatment.

For example, a resist film having a trade name of UV6 can be used, and the TMAH developing solution can have a low concentration, e.g., 1.55%. In addition, it is possible to scan the developing solution nozzle 86 a plurality of times so as to supply the surfactant containing liquid a plurality of times onto the wafer W, and/or to supply the developing solution of a low concentration a plurality of times onto the wafer W.

In the method for carrying out the developing reaction by supplying a developing solution onto the stationary wafer W as described above, the developing solution tends to be supplied in a large amount to the central portion of the wafer W, but the surfactant-containing layer counteracts this situation with the result that the developing reaction proceeds uniformly across the wafer so as to cause the line width of the circuit pattern to be rendered uniform across the wafer. In this case, the line width of 0.18 micrometers provides the target value of the development.

In some cases, the resist film on the wafer W can have a low dissolving rate in a developing solution. In this case, a developing solution of a high concentration, e.g., 2.38%, is supplied onto the wafer W in the present invention, and the wafer W receiving the developing solution is left to stand for a prescribed time. The particular process makes it possible to suppress the non-uniformity in CD.

In some cases, the resist film on the wafer W can have low contrast, i.e., a resist film having a small difference in the solubility in the developing solution between the exposed portion and the unexposed portion. In this case, the concentration of the surfactant-containing liquid and/or the concentration of the developing solution used in different process steps can be set to maximize the throughput. Where a positive resist film low in contrast is formed on the wafer W, the unexposed portion of the resist film can be gradually dissolved under the influence of the diffracted light in the exposure step, with the result that it is difficult to obtain a pattern satisfactory in the accuracy of the shape. However, the dissolution of the unexposed portion can be prevented by using a developing solution of a low concentration in the latter stage of the developing reaction so as to lower the rate of the developing reaction. As a result, it is possible to form an excellent circuit pattern.

In some cases, the resist film on the wafer W can absorb water contained in the developing solution and thereby become swollen. It should be noted that, if the resist film absorbs water contained in the surfactant-containing liquid and/or the developing solution during the process of the developing reaction so as to be swollen, the accuracy in the shape of the circuit pattern formed is lowered. For example, the line width of the resist pattern remaining after the developing processing is increased, and the wall surface of the resist pattern is roughened so as to lower the accuracy in the shape of the circuit pattern formed. Under the circumstances, in order to suppress the water absorption of the resist film, a surfactant-containing liquid and/or a developing solution having a higher concentration can be used.

In addition to the above-described methods, pure water can be supplied before, during, and/or after the application of the surfactant-containing liquid and/or the developing solution. However, some resist materials give rise to the problem that, when a pure water is added to a developing solution so as to dilute the developing solution, the pH value of the developing solution is rapidly changed so as to precipitate the dissolved product in the form of a solid, and the precipitated material is attached to the developed pattern. In this case, it is necessary for the liquid performing the pH adjusting function not to dissolve the resist film or to be low in the dissolving power of the resist film and not to react with the components of the developing solution and the dissolved product of the resist so as not to precipitate a solid material. It is possible to suppress the change in the pH value of the developing solution supplied previously onto the wafer W and to suppress the generation of a solid precipitate by using a solution having a pH value of 9 to 12 such as an ammonia water, an aqueous solution prepared by adding a prescribed amount of a surfactant to a pure water, or a hydrophilic organic solvent.

The present invention is not limited to the various embodiments described above. For example, the method of the present invention for the developing processing can be suitably applied to the cases where an exposure treatment is applied to a resist film by using a KrF ray, an ArF ray or an $F_2$ ray. Further, a developing process of a higher accuracy can be performed in the case of using a g-line or an i-line. Further, the description given above covers the developing method with attentions paid to the reactivity of the resist film (resist material) relative to the developing solution. Where, for example, the resist film has a high dissolving rate in the developing solution and tends to be swollen easily by the developing solution, the concentration of the developing solution used in the latter stage of the developing reaction is set at a value at which the resist film is not excessively dissolved and, in addition, the dissolving rate is balanced with the swelling rate.

In the description given above, a TMAH solution having a concentration of 2.38% was exemplified as a developing solution having a high concentration. Of course, it is possible to use a developing solution having a higher concentration as far as a prescribed accuracy of the shape and a prescribed CD uniformity can be obtained. Alternately, it is possible to construct the developing solution nozzle having a slit type deposition port. In this case, liquid can be provided onto the surface of the wafer W while preventing the tip of the nozzle from contacting the liquid supplied previously onto the wafer W.

In each of the embodiments described above, a semiconductor wafer is exemplified as a substrate. However, it is also possible to apply each of the various methods for the development process described above to the photolithography step of, for example, a glass substrate for a liquid crystal display (LCD).

It should be noted that the embodiments described above are simply intended to clarify the technical idea of the present invention. Naturally, the technical scope of the present invention should not be construed solely on the basis of the specific embodiments described above. In other words, the present invention can be worked in variously modified fashions on the basis of the spirit of the present invention and within the scope defined in the accompanying claims.

What is claimed is:

1. A method for processing of a resist film formed on a substrate, the method comprising the steps of:
   depositing a resist film on the substrate;
   applying a sacrificial surfactant-containing liquid onto the resist film to pre-wet the resist film and wherein a concentration for the surfactant-containing liquid is determined based on a thickness of the resist film, wherein the sacrificial surfactant-containing liquid is chosen based on one or more characteristics of the resist film;

selecting a concentration of a developing solution in accordance with one or more characteristics of the sacrificial surfactant-containing liquid and the resist film;

supplying the developing solution onto the resist film after applying the resist film surfactant-containing liquid on the substrate to displace the sacrificial surfactant-containing liquid;

developing the resist film by allowing the substrate having the developing solution supplied thereto to stand for a prescribed time sufficient to permit a developing reaction to proceed; and thereafter, rinsing the substrate.

2. The method as claimed in claim 1, wherein the sacrificial surfactant-containing liquid comprises at least one of an ionic surfactant, a nonionic surfactant, an anionic surfactant, and a cationic surfactant.

3. The method as claimed in claim 1, the method further comprising:

determining a concentration for the sacrificial surfactant-containing liquid based on the resist film and one or more characteristics of selecting the concentration of the developing solution based on the concentration of the sacrificial surfactant-containing liquid.

4. The method as claimed in claim 1, the method further comprising:

determining a concentration for the sacrificial surfactant-containing liquid based on water solubility of the resist film.

5. The method as claimed in claim 1, the method further comprising:

determining a contact angle for the developing solution on the resist film; and determining a concentration for the sacrificial surfactant-containing liquid effective to achieve a decrease in the contact angle.

6. The method as claimed in claim 1, the method further comprising:

prior to applying the sacrificial surfactant-containing liquid, transferring the substrate having the resist film thereon into a developing unit; and positioning the substrate on a spin chuck, wherein the applying and the supplying are performed while rotating the spin chuck.

7. The method as claimed in claim 6, the method further comprising:

after the rinsing, drying the substrate while rotating the spin chuck; and transferring the substrate out of the developing unit.

8. The method as claimed in claim 1, further comprising rotating the substrate during the step of applying, and wherein the step of applying a sacrificial surfactant-containing liquid onto the resist film is carried out by using a nozzle capable of depositing the sacrificial surfactant-containing liquid in a substantially circular shape, the nozzle being positioned over the center of the substrate while depositing the sacrificial surfactant-containing liquid onto the rotating substrate.

9. The method as claimed in claim 1, wherein the step of applying a sacrificial surfactant-containing liquid onto the resist film is carried out by using a nozzle capable of depositing the sacrificial surfactant-containing liquid in a substantially band shape, the nozzle being scanned over the substrate while depositing the sacrificial surfactant-containing liquid.

10. The method as claimed in claim 1, wherein the step of applying a sacrificial surfactant-containing liquid onto the resist film is carried out by using a plurality of nozzles each capable of depositing the sacrificial surfactant-containing liquid in a substantially band shape, the plurality of nozzles being scanned over the substrate while depositing the sacrificial surfactant-containing liquid.

11. The method as claimed in claim 1, further comprising rotating the substrate during the step of supplying, and wherein the step of supplying the developing solution onto the resist film is carried out by using a nozzle capable of depositing the developing solution in a substantially circular shape, the nozzle being positioned over the center of the substrate while depositing the sacrificial developing solution onto a rotating substrate.

12. The method as claimed in claim 1, wherein the step of supplying the developing solution onto the resist film is carried out by using a nozzle capable of depositing the developing solution in a substantially band shape, the nozzle being scanned over the substrate while depositing the developing solution.

13. The method as claimed in claim 1, wherein the step of supplying the developing solution onto the resist film is carried out by using a plurality of nozzles each capable of depositing the developing solution in substantially a band shape, the plurality of nozzles being scanned over the substrate while depositing the developing solution.

14. The method as claimed in claim 1, wherein the step of applying a sacrificial surfactant-containing liquid onto the resist film is carried out by using a nozzle capable of depositing the sacrificial surfactant-containing liquid in dropwise fashion, the nozzle being positioned over the center of the substrate while depositing at least one drop of the sacrificial surfactant-containing liquid onto the substrate while rotating the substrate.

15. The method as claimed in claim 1, wherein the substrate having the developing solution supplied thereto is rotated for at least a portion of the prescribed time.

\* \* \* \* \*

UNITED STATES PATENT AND TRADEMARK OFFICE
CERTIFICATE OF CORRECTION

PATENT NO.        : 7,498,124 B2
APPLICATION NO. : 10/675419
DATED             : March 3, 2009
INVENTOR(S)       : John M. Kulp Page 1 of 1

It is certified that error appears in the above-identified patent and that said Letters Patent is hereby corrected as shown below:

On the Title Pg Item (57) ABSTRACT, "A method and apparatus for" should read --A method for--.

Col. 1, lines 36-37, "spin-drying in this case," should read --spin-drying. In this case,--.

Col. 9, line 14, "i.e., subjected a surfactant-containing" should read --i.e., subjected to a surfactant-containing--.

Col. 13, line 7, Claim 1, "applying the resist film surfactant-containing" should read --applying the sacrificial surfactant-containing--.

Col. 13, line 8, Claim 1, "the substrate to displace" should read --the resist film to displace--.

Signed and Sealed this

Twenty-ninth Day of December, 2009

David J. Kappos
*Director of the United States Patent and Trademark Office*